(12) United States Patent
Price, Jr.

(10) Patent No.: US 6,967,525 B2
(45) Date of Patent: Nov. 22, 2005

(54) TAIL CURRENT GENERATOR CIRCUIT FOR BIPOLAR/MOS DIFFERENTIAL PAIR TO SET PRECISE TRANSCONDUCTANCE

(75) Inventor: John Joseph Price, Jr., Eagan, MN (US)

(73) Assignee: Texas Instruments Incorporated, Dallas, TX (US)

( * ) Notice: Subject to any disclaimer, the term of this patent is extended or adjusted under 35 U.S.C. 154(b) by 2 days.

(21) Appl. No.: 10/694,065

(22) Filed: Oct. 27, 2003

(65) Prior Publication Data

US 2005/0088203 A1 Apr. 28, 2005

(51) Int. Cl.$^7$ .............................. G05F 1/10
(52) U.S. Cl. ........................... 327/542; 330/261
(58) Field of Search .................... 327/65–67, 89, 327/530, 538, 540, 541, 542; 330/251, 252, 254, 261; 360/46

(56) References Cited

U.S. PATENT DOCUMENTS 6,552,612 B1 * 4/2003 Wilson ....................... 330/254

* cited by examiner

Primary Examiner—Kenneth B. Wells
(74) Attorney, Agent, or Firm—W. Daniel Swayze, Jr.; W. James Brady; Frederick J. Telecky, Jr.

(57) ABSTRACT

Disclosed is a circuit and method for generating a tail current for a main reader amplifier (200) input stage using a scaled master differential stage (160) with a given offset to force a given output current, preceded by a balanced stage (150) to get a balanced offset. Current must be set by a feedback arrangement in the dummy master stage (160) which is a scaled version of the main reader amplifier input stage (200). The current derived in the dummy master stage (160), when appropriately scaled and used as the tail current of the main reader amplifier (200) input stage provides a precisely controlled gain.

23 Claims, 4 Drawing Sheets

TAIL CURRENT GENERATOR CIRCUIT FOR BIPOLAR/MOS DIFFERENTIAL PAIR TO SET PRECISE TRANSCONDUCTANCE

TECHNICAL FIELD

The present invention relates to circuits used to sense and amplify low level signals, including those used in reader amplifier circuitry of data storage systems, including disk drive systems.

BACKGROUND OF THE INVENTION

Digital data is often stored by being electronically "written" to the surface of a disk in a hard-disk drive. This digital data or information is retrieved, or read back, by means of a magneto-resistive ("MR") element in close proximity to the spinning disk. The small signal (in the millivolt range) from the MR element in a hard disk drive must be AC-coupled before it is presented to the reader amplifier due to the significant DC voltage (up to several hundred millivolts) across the MR element. The low-corner −3 dB frequency of that AC coupling must be set low enough so that none of the significant bandwidth of the signal is lost. Low-corner −3 dB frequencies on the order of 1 MHz and above are conventionally available. However, recent advances in disk drive technology such as vertical recording, have required that the low-corner −3 dB frequency be lowered by around an order of magnitude. This is significant enough to require modifications to the design of the reader amplifier front-end. The reader amplifier input stage has traditionally been comprised of NPN bipolar transistors because of their low noise characteristics. However, the base current associated with these transistors makes it difficult to achieve the low-corner −3 dB frequency required for vertical recording.

The transconductance of an all-bipolar junction transistor pair can be set by a predetermined tail current and conventional arrangements use NPN transistors as the input differential pairs. As such, the gain can be accurately determined from the tail current as bipolar transconductance is set precisely by the current. However, the transconductance of an NPN/NMOS or PNP/PMOS differential pair is not set by a predetermined tail current as is the case with an all-bipolar pair.

The present invention utilizes a scaled master differential stage with a given offset to force a given output current, preceded by a balanced stage circuit comprised of the bipolar/MOS differential pair to get a balanced offset. The result is a tail current for the main amplifier input stage.

SUMMARY OF THE INVENTION

The invention achieves technical advantages as a circuit arrangement and method by which the transconductance of an NPN/NMOS differential pair is precisely set by utilizing a scaled master differential stage with given offset to force a given output current. This is preceded by a balanced stage to get the balanced offset. The result is a tail current for the main amplifier input stage.

Numerous advantages are provided by the invention, including but not limited to the advantageous use of an NPN/NMOS differential pair, or PNP/PMOS differential pair, to achieve a low, low-corner −3 dB frequency as well as low noise, while obtaining a tail current for the main amplifier input stage.

The main reader amplifier consists of several stages, typically three or four, the first of which is most critical for noise considerations. It needs to have as high a gain as possible so that subsequent gain stages contribute less to overall noise, and the gain needs to be precisely controlled for the reader amplifier's input impedance to be set accurately. As previously mentioned, the gain of the input stage utilizing an NPN/NMOS differential pair cannot be accurately set simply by providing an independently determined tail current as with an all NPN differential pair. In this case the current must be set by a feedback arrangement in a dummy master stage which is a scaled version of the main reader amplifier input stage. The current derived in this master stage, when appropriately scaled and used as the tail current of the main reader input stage, will provide a precisely controlled gain in this stage.

These and many other advantages related to the improvements of the invention will become apparent to persons skilled in the relevant arts through careful reading of the disclosure and claims presented herein.

BRIEF DESCRIPTION OF THE DRAWINGS

For a better understanding of the invention including its features, advantages and specific embodiments, reference is made to the following detailed description along with accompanying drawings in which.

Figure 1A:
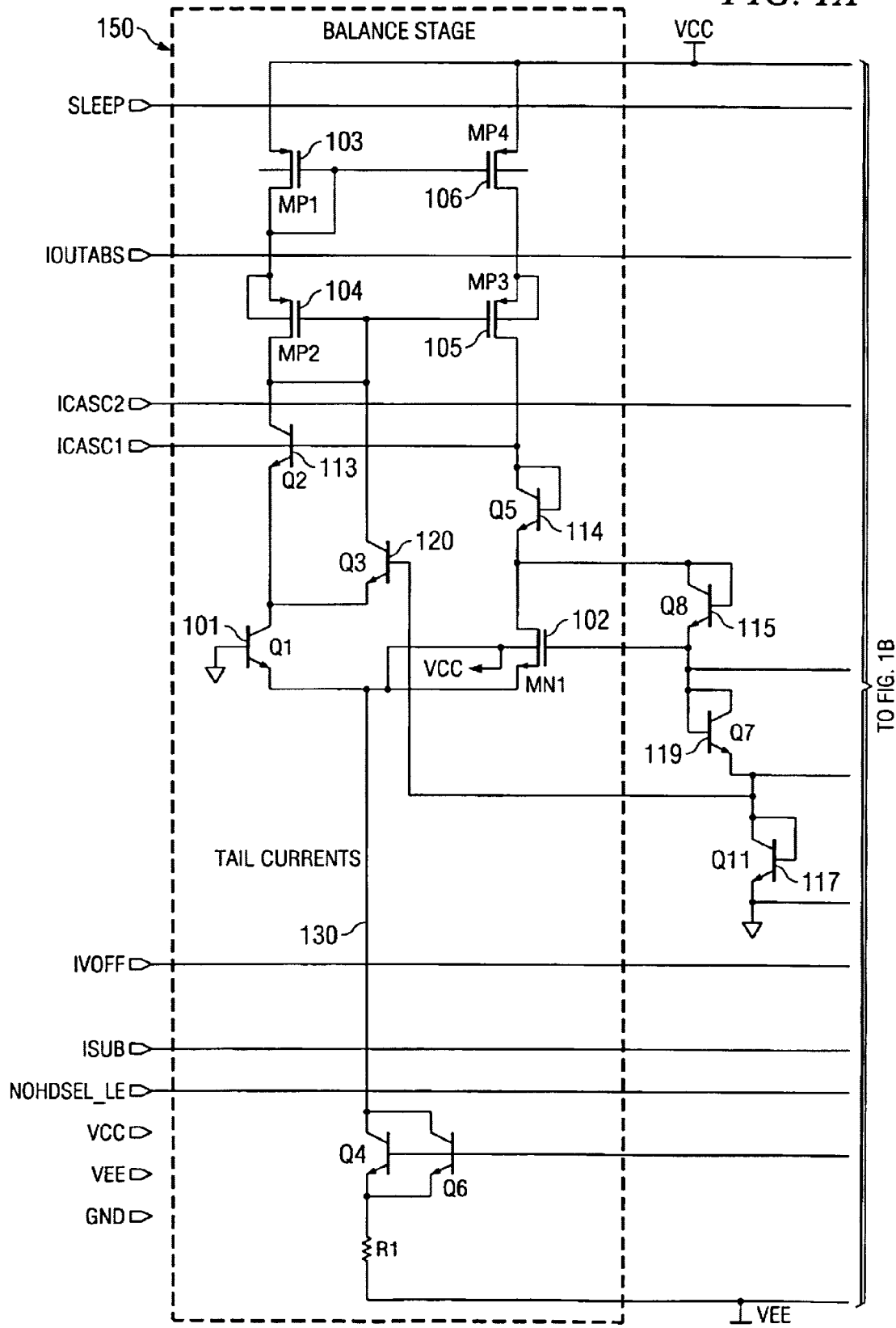
FIG. 1 is a circuit schematic illustrating the scaled master differential stage with given offset to force a given output current, preceded by a balanced stage to obtain a balanced offset.

References in the detailed description correspond to like references in the figures unless otherwise noted. Descriptive and directional terms such as top, bottom, left, right, first, second, refer to the drawing itself as laid out on the paper and not to physical limitations of the invention unless specifically noted.

DETAILED DESCRIPTION OF PREFERRED EMBODIMENTS

While the making and using of various embodiments of the present invention are discussed in detail below, it should be appreciated that the present invention provides many applicable inventive concepts which can be embodied in a wide variety of specific contexts.

The transconductance of an all-bipolar junction transistor pair can be set by a predetermined tail current. However, the transconductance of a bipolar/MOS differential pair is not set by a predetermined tail current as is the case with an all-bipolar pair. Thus it is an objective of the present invention to configure an input stage using both a bipolar transistor, such as an NPN, coupled to the MR element and an MOS transistor, such as and NMOS (which has no input current equivalent to the bipolar NPN's base current) coupled to the AC-coupling capacitor. Alternatively PNP and PMOS transistors can be used to accomplish the objectives of the present invention assuming a reversal of the polarity of the corresponding circuit. Although a single bipolar/MOS differential pair is described herein, such description is not meant to be limiting as a plurality of bipolar and MOS transistors arranged as differential pairs can be used to implement the present invention.

The present invention utilizes a scaled master differential stage 160 with a given input voltage offset to force a given output current, preceded by a balanced stage 150 which includes a bipolar/MOS differential pair to obtain a balanced offset. The result is a tail current for the main amplifier input stage.

It is well-known in the art to use a scaled master stage with a given offset. However, the novel aspect of the present invention is that the scaled master stage with a given offset is preceded by a balanced stage to provide the scaled master stage with a balanced offset. It is desirous to have an input stage differential pair designed with an NPN and an NMOS device, or PNP and PMOS device, in order to achieve a low, low-corner −3 dB frequency as well as low noise. As noted, conventional arrangements that use bipolar transistors as the input differential pair allow the gain to be accurately determined from the tail current as bipolar transconductance is set precisely by the current. However, there are significant advantages to using a MOS transistor as one of the differential pair devices. Disadvantageously, gain cannot be set by a predetermined tail current when a MOS transistor as one of the differential pair devices. In such case, a feedback means is needed to set the tail current of the differential pair to achieve the desired gain.

The input impedance of a conventional preamplifier reader amplifier is typically set to match the characteristic impedance of the interconnect by means of feedback resistors coupled from the first-stage output back to the input. Typical impedances are set to about 70 Ohms. Often, it is more important to accurately determine the input impedance of the reader amplifier than the gain of the amplifier. The reason for this is that there is typically considerable variability in the DC resistance and output signal strength of the MR elements due to manufacturing tolerances and between multiple vendors. This produces considerable variability in signal amplitude at the reader amplifier output. Through the serial register a wide range in reader amplifier gain can be programmed to accommodate this variability. However, the interconnect from the read head to the preamplifier input is a controlled characteristic impedance. By matching the input impedance of the reader amplifier to the interconnect characteristic impedance the signal integrity is best maintained. Thus the most important parameter to set is the reader amplifier input impedance. Therefore, the present invention advantageously provides the means to set the tail current of the differential pair using a predetermined input impedance of the reader amplifier rather than the absolute gain of the reader amplifier.

More specifically, the input impedance of the reader amplifier is determined by the feedback resistors and the gain of the first stage of the reader amplifier. The equation for input impedance is:

$$R_{IN} \cong 2\left(\frac{R_F}{|Av_1|+1}\right)$$

where $R_{IN}$ is the differential input impedance, $Av_1$ is the first stage gain and $R_F$ is the feedback resistor (one from each side output back to input).

The value of $R_F$ varies according to process and temperature. If $Av_1$ can be made to track $R_F$, then $R_{IN}$ will be constant over process and temperature.

The present invention comprises a master transconductance (gm) stage substantially identical but scaled down from the main reader gain stage of the reader amplifier. In operation, it is given an input offset of 50 mV and its output is made to match an absolute current which is trimmed to tight accuracy. Thus the master gm stage has a precise gm independent of processing variations. The first stage amplifier gain is set with a scaled-up gm stage and load resistors. Its gain is thus:

$$Av_1 = g_m \cdot R_L$$

where $R_L$ is the value of the collector load resistors. This results in:

$$R_{IN} \cong 2\left(\frac{R_F}{|g_m \cdot R_L|+1}\right)$$

If the resistors $R_F$ and $R_L$ match, and if the first stage gain is considerably greater than unity, then the input impedance will be constant over processing variations and temperature.

In order to set the input differential voltage of the master stage to 50 mV, the nominal balanced input voltage must be determined. Therefore, an additional stage with feedback is necessary to force it to balance.

Figure 1B:
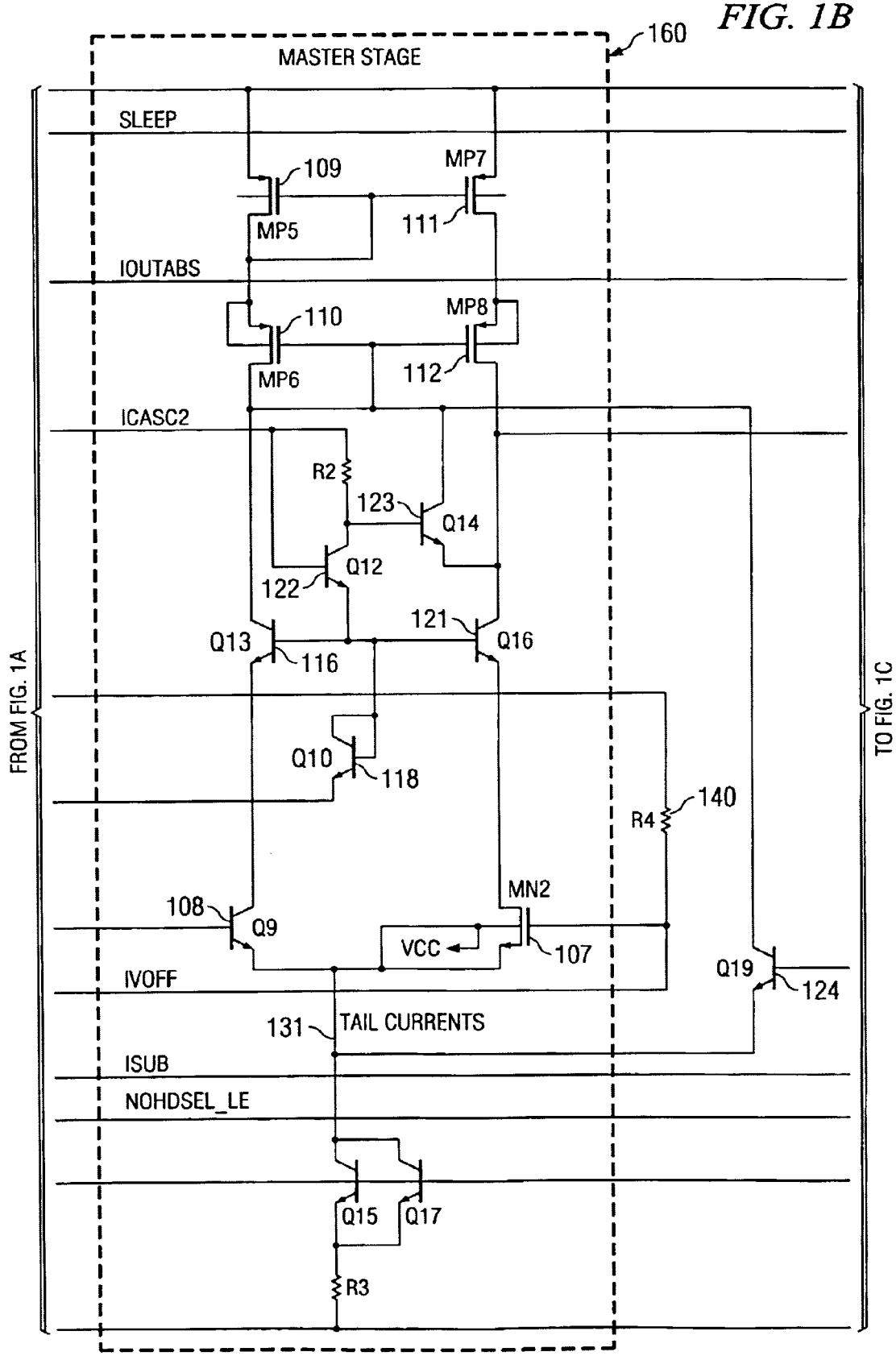
Figure 1C:
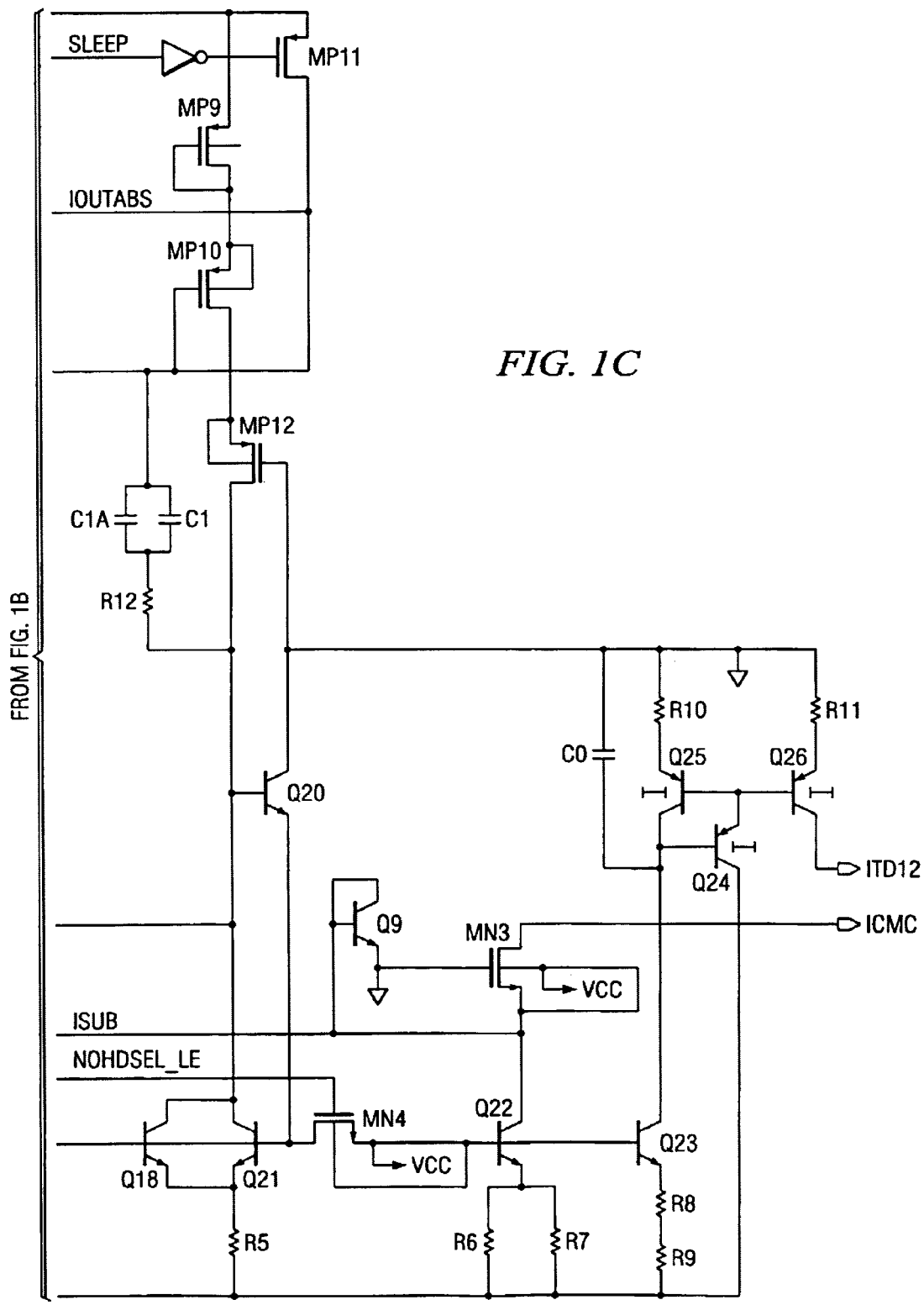

FIG. 1 illustrates the implementation of the present invention using an NPN/NMOS differential pair, although a PNP/PMOS differential pair could be utilized if circuit polarities are reversed. Referring to FIG. 1, the balanced stage is formed by bipolar transistor Q1 101 and NMOS transistor NM1 102 differential pair, which has a tail current of one-fourth the tail current of the normal reader input stage. PMOS transistors MP1 103, MP2 104, MP3 105 and MP4 106 form a 1:2 current mirror to force twice the current of transistor Q1 101 back to NMOS transistor MN1 102. This current ratio is set for the main reader amplifier input stage to optimize performance and minimize noise. The voltage thus set by feedback at the gate of NMOS transistor 102 is sent over to the master stage through resistor 140 of 500 Ohms with 100 µA flowing to drop 50 mV. This is applied to NMOS transistor MN2 107 which, along with bi-polar transistor Q9 108, form the master differential pair. The collector current of transistor Q9 108 is mirrored by PMOS mirror comprised of PMOS transistors MP5 109, MP6 110, MP7 111 and MP8 112, which forms a 1:2 mirror as in the main first stage of the reader amplifier seen in FIG. 2. This mirror's output is compared with the drain current of NMOS transistor MN2 107 and an added 1-mA absolute current, with the remaining current driving the bottom current sources 130 and 131 which are the tail currents. Thus the master stage 160 is forced to have a gm of 1 mA output current with 50 mV input, or 20 mS. The main differential stage will have a gm of 80 mS, since it is scaled up by a factor of four and has four times the tail current.

Current ICASC1 is used to compensate for the current IVOFF that is used to derive the 50-mV drop in resistor 140. Bipolar transistors Q2 113, Q5 114, Q13 116 and Q16 121 are cascodes to match those in the same configuration in the main amplifier. Additional bi-polar NPN transistors Q8 115, Q11 117 and Q10 118, are used to set proper voltage levels for the cascode transistors Q2 113, Q5 114, Q13 116 and Q16 121. Other NPN transistors Q3 120, Q7 119 (to the right of MN1), Q12 122, Q14 123 and Q19 124, serve to prevent latch conditions during power on. Outputs ITD12 (tail current divided by 12) and ICMC are shipped to the main reader input stages.

The main reader amplifier consists of several stages, typically three or four, the first of which is most critical for noise considerations. It needs to have as high a gain as possible so that subsequent gain stages contribute less to overall noise, and the gain needs to be precisely controlled for the reader amplifier's input impedance to be set accurately. As previously mentioned, the gain of the input stage utilizing a bipolar/MOS differential pair cannot be accurately set simply by providing an independently determined tail current as can be accomplished with an all NPN differential pair. In this case the current must be set by a feedback arrangement in a dummy master stage 160 which is a scaled version of the main reader amplifier input stage 200 as discussed earlier. The current derived in this dummy master stage 160, when appropriately scaled and used as the tail current of the main reader amplifier 200 input stage, will provide a precisely controlled gain.

Figure 2:
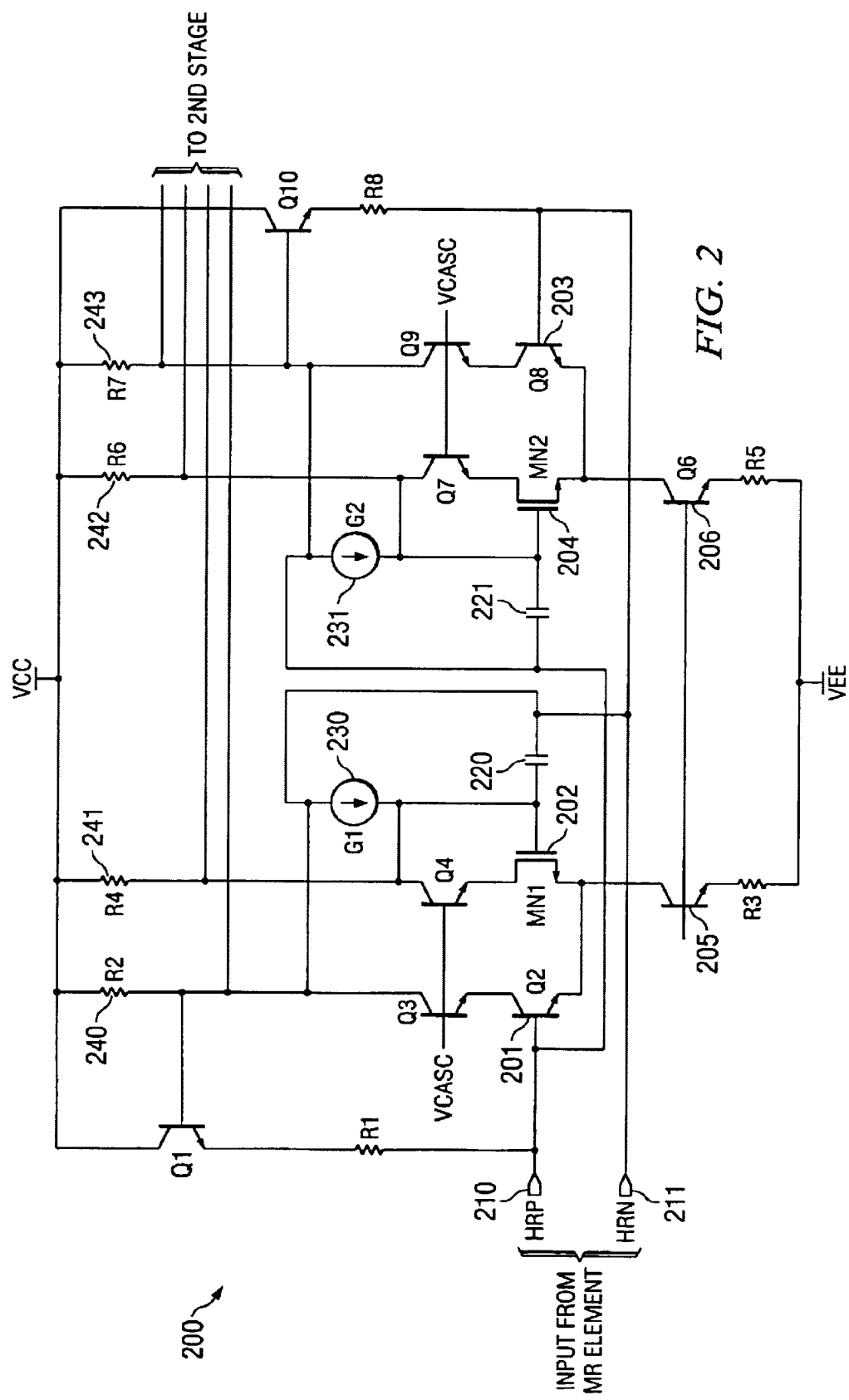
FIG. 2 is a schematic of the first stage of the main reader amplifier.

FIG. 2 is a schematic of the first stage of the main reader amplifier. As seen therein, there are two input differential bipolar/MOS pairs, here NPN and NMOS, for symmetry, specifically, Q2 201/MN1 202 and MN2 204/Q8 203. Tail currents (It) for each are provided from Q5 205 and Q6 206. Inputs from the MR element at HRP 210 and HRN 211 connect to the input differential pairs, one of each directly to the NPNs Q2 201 and Q8 203, and one of each through capacitors C1 220 and C2 221 to the NMOSFETs MN1 202 and MN2 204. Proper DC bias for the gates of NMOS transistors MN1 202 and MN2 204 are provided by GM stages G1 230 and G2 231 of variable transconductance. The low-corner −3 dB frequency is set by the value of transconductance of G1 230 and G2 231 in conjunction with the values of C1 220 and C2 221. Collector resistors R2 240, R4 241, R6 242 and R7 243 determine the gain of this stage in conjunction with the transconductance of the input differential stages. Signals are taken from these resistors to the next stage of amplification.

The embodiments shown and described above are only exemplary. Even though numerous characteristics and advantages of the present invention have been set forth in the foregoing description together with details of the method of the invention, the disclosure is illustrative only and changes may be made within the principles of the invention to the full extent indicated by the broad general meaning of the terms used in the attached claims. Reference to an NPN/NMOS differential pair is not limiting in that the invention can be implemented using a bipolar PNP and PMOS differential pair.

I claim:

1. A circuit adapted to generate a tail current for a main amplifier stage, comprising:
    a master stage circuit;
    a balanced stage circuit;
    master stage circuit responsively coupled to the balanced stage circuit,
    the master stage having a predetermined offset operable to force a given tail current to the balanced stage circuit and a main reader amplifier; and
    the balanced stage circuit comprising at least one bi-polar and MOS transistor differential pair adapted to provide a balanced offset to the master stage circuit.

2. The circuit adapted to generate a tail current for a main amplifier stage of claim 1, wherein said main reader amplifier is in combination with the circuit adapted to generate a tail current for the main amplifier stage.

3. The circuit of claim 1, wherein the bi-polar transistors comprise NPN transistors and the MOS transistors comprise NMOS transistors.

4. The circuit of claim 1, wherein the bi-polar transistors comprise PNP transistors and the MOS transistors comprise PMOS transistors.

5. The circuit of claim 1, being adapted to achieve a low, low-corner −3 dB frequency and low noise threshold compared to an all bipolar differential pair.

6. The circuit adapted to generate a tail current for a main amplifier stage of claim 1, wherein the tail current of the master stage circuit is adapted to drive semiconductor devices in a reader amplifier.

7. Bias circuitry for a reader amplifier, comprising:
    a master transconductance (gm) stage configured as a scaled reader amplifier;
    a balanced stage circuit; and
    the scaled reader amplifier responsively coupled to the balanced stage circuit,
    the scaled reader amplifier operable to provide a tail current for the balanced stage circuit and a reader amplifier.

8. The bias circuitry for a reader amplifier of claim 7, having an output matching an absolute current as a function of a predetermined voltage input offset.

9. The bias circuitry for a reader amplifier of claim 8, wherein the predetermined voltage input offset is about 50 mV.

10. The bias circuitry for a reader amplifier of claim 7, wherein the master transconductance stage has a precise gm independent of processing variations.

11. A circuit arrangement for providing a tail current to an amplifier, comprising:
    a scaled master differential stage;
    a balanced stage circuit comprising at least one bi-polar and MOS transistor differential pair adapted to provide a balanced offset to the scaled master differential stage;
    the scaled master differential stage having a given offset adapted to force a given tail current.

12. The circuit arrangement for providing a tail current to an aimplifier of claim 11 in combination with a main reader amplifier.

13. The circuit arrangement of claim 11, wherein said at least one bipolar transistor is responsively coupled to a magneto-resistive element and at least one MOS transistor is responsively coupled to an AC-coupling capacitor.

14. The circuit arrangement of claim 11 wherein the bipolar transistor comprises an NPN transistor and the MOS transistor comprises an NMOS transistor.

15. The circuit arrangement of claim 11, wherein the bipolar transistor comprises a PNP transistor and the MOS transistor comprises a PMOS transistor.

16. A tail current generator circuit, comprising:
    a master transconductance stage;
    a balanced offset stage including at least one bipolar-MOS differential transistor pair adapted to provide a balanced offset to the master transconductance stage;
    the master transconductance stage adapted to set a precise transconductance of the bipolar-MOS differential transistor pair; and
    the tail current generator circuit responsive to the master transconductance stage and operable to provide an output which matches an absolute current as a function of a predetermined voltage input offset.

17. The tail current generator circuit of claim 16, wherein the bipolar transistor comprises an NPN transistor and the MOS transistor comprises an NMOS transistor.

18. The tail current generator circuit of claim 16, wherein the bipolar transistor comprises a PNP transistor and the MOS transistor comprises a PMOS transistor.

19. A method of generating a tail current for an amplifier, comprising the steps of:
    adapting a differential, scaled master stage to accept a balanced offset;
    generating a current by a feedback arrangement in the differential, scaled master stage;
    scaling the current derived in the differential, scaled master stage; and
    providing the scaled current as the tail current for an amplifier.

20. The method of generating a tail current of claim 19, further comprising using a bipolar/MOS differential pair in a balanced stage circuit to provide the balanced offset.

21. The method of generating a tail current of claim 20, wherein said at least one bipolar transistor is responsively coupled to a magneto-resistive element and at least one MOS transistor is responsively coupled to an AC-coupling capacitor.

22. The method of generating a tail current for an amplifier of claim 19, wherein the differential, scaled master stage is a scaled version of a main reader amplifier input stage.

23. The method of generating a tail current of claim 19, for use as a bias circuit in a reader amplifier of a disk drive system.

* * * * *